United States Patent [19]
Hardin et al.

[11] Patent Number: 6,102,959
[45] Date of Patent: Aug. 15, 2000

[54] VERIFICATION TOOL COMPUTATION REDUCTION

[75] Inventors: Ronald H. Hardin, Pataskala, Ohio; Robert Paul Kurshan, New York, N.Y.

[73] Assignee: Lucent Technologies Inc., Murray Hill, N.J.

[21] Appl. No.: 09/067,437

[22] Filed: Apr. 27, 1998

[51] Int. Cl.[7] .................................................. G06F 17/50
[52] U.S. Cl. ................................................ 703/2; 703/13
[58] Field of Search ......................... 395/500.36, 183.01, 395/183.02, 183.08, 500.34, 500.43, 500, 709; 371/25.1; 364/578; 703/2, 13; 714/732–744

[56] References Cited

U.S. PATENT DOCUMENTS

| | | | |
|---|---|---|---|
| 5,202,889 | 4/1993 | Aharon et al. | 714/739 |
| 5,465,216 | 11/1995 | Rotem et al. | 364/488 |
| 5,910,897 | 6/1999 | Dangelo et al. | 395/500.2 |
| 5,946,481 | 8/1999 | Kurshan et al. | 395/500.34 |

OTHER PUBLICATIONS

IBM Technical Disclosure Bulletin, v28, issue 7 pp 3128–3129, Index Method for test Pattern Reduction, Dec. 1, 1985.

IBM Technical Disclosure Bulletin, v31, issue 8 pp 467–468, Random Pattern Testing of LSSD Logic Devices by Multiple Sets of Weights.

*Primary Examiner*—Kevin J. Teska
*Assistant Examiner*—Lonnie A. Knox
*Attorney, Agent, or Firm*—James DiGiorgio; Stephen M. Gurey

[57] ABSTRACT

A method wherein a verification tool checks the properties of a system model by performing a partial search of the system-model state space. A partial search is a search wherein the verification tool inputs, at each state of the system-model state space, only a subset or fraction of the complete set of inputs that would have been used during a conventional search. Performing a partial search, instead of a conventional search, reduces the total number of inputs that the verification tool will input to the system model during a search of the system-model state space, thus reducing the amount of computational resources and/or time needed by the verification tool to verify given properties of the system model. Moreover, performing a partial search, instead of a conventional search, does not substantially reduce the ability of the verification tool to identify errors in the system-model.

10 Claims, 2 Drawing Sheets

VERIFICATION TOOL COMPUTATION REDUCTION

CROSS REFERENCE TO RELATED APPLICATION

This application is related to our applications entitled "Method For Detecting Errors In Models Through Restriction," Serial No. 08/871,022, filed Jun. 6, 1997 now U.S. Pat. No. 5,901,073, and "Method For Detecting Errors In Models Through Restriction," Serial No. 08/923,297 now U.S. Pat. No. 5,946,481, filed Sep. 4, 1997, where the latter is a continuation-in-part of the former.

FIELD OF THE INVENTION

The present invention relates to the testing of system designs, and more particularly to an apparatus and method for reducing the amount of computational resources and/or time needed to test a system model.

BACKGROUND OF THE INVENTION

An ongoing problem in the design of large systems is verifying that the system will behave in the manner intended by its designers. One approach has been to simply try out the system, either by building and testing the system itself or by building and testing a model of the system. Since there is no guarantee that an untested system will work as expected, building the system itself can be an expensive proposition. Thus, those skilled in the art have migrated toward building and testing a model of the system, or system model, through software.

A system model can be said to be a computer program or block of code that, when executed, simulates the intended properties, or functions, of the system. Basically, the system model is designed to accept inputs, perform functions and generate outputs in the same manner as would the actual system. To do this, the system model uses variables, called system-model variables, that are programmed within the code to take on certain values depending on the values of the inputs to the system model. That is, as different values are fed to the system-model inputs, the system-model variables are assigned different values that indicate how the system model functions or behaves in response to the inputs. Thus, by controlling the value of the inputs to the system model and monitoring the values of the system-model variables, a system designer can test or observe the behavior of the system model in response to different sets of inputs, and determine whether the system model exhibits, or performs, the intended properties of the system.

One method of testing a system model in such a manner is called formal verification. In formal verification, a verification tool is used to convert the system model into a finite state machine. A finite state machine is a set of states and state transitions which mimic the operation of the system model in response to given sets of inputs, or input vectors. The term "set of inputs" as used herein refers to the values input to each system-model input at any given time, and the term "input vectors" as used herein refers to the sets of inputs successively fed to the system model inputs over a period of time.

In general, each state of a finite state machine represents a specific assignment of values to a set of system-model variables, and thus represents a specific behavior of the system model. Each state transition defines the values that a set of system-model inputs and/or system-model variables must take on for the state machine to transition from one state to another state. The state machine thereby provides a roadmap of how a system model will behave, i.e. the states the system model will enter, in response to the values input to the system-model inputs. As a result, once the verification tool converts the system model into such a finite state machine, the tool can use the state machine or roadmap to test the behavior of the system model.

To illustrate, conventional verification tools, such as the explicit-state enumeration-based verification tool described by R. P. Kurshan in *Computer Aided Verification of Coordinating Processes*, Princeton University Press 1994, are designed to test the behavior of the system model by performing a so-called search of the system-model state space (i.e. the set of states and state transitions that represent the behavior of the system model). Conventionally, a search is performed by inputting to the system model a "complete set of inputs" at each state of the system model, and monitoring the behavior of the system model in response thereto. The term "complete set of inputs" as used herein refers to every possible set of values that the system-model inputs can possibly assume when the system model is in operation, in every possible sequence. Such a complete set of inputs is an input vector.

The more complex a system model becomes (i.e. the greater the number of system model inputs, the wider the range of assumable values for each input, and/or the greater the number of states or system model variables), the greater the amount of computational resources and/or time necessary to complete a search of the system-model state space. In fact, it has been found that performing a search of a sufficiently complex model with a conventional verification tool can cause the verification tool to run out of computational resources (e.g. no more RAM available to the search engine). When this happens, the verification tool may "lock-up", or stop the search, without providing the tester with data as to whether the system model had behaved as expected for any part of the search performed before the "lock-up." As a result, when performing a conventional search on such complex system models, the tester may be left with no way of determining whether the system model has a design error.

One solution to this problem is to reduce the size of the system model and run a search on the reduced model. That is, a tester or programmer experienced in the details of the system model, including how the system-model inputs and system-model variables affect the behavior of the system model, may eliminate portions of the system model, including lines of code and/or system-model inputs and variables, that appear to have no effect on a limited set of system behaviors or functions which the programmer decides are not critical to check. To do this, the programmer must take care to insure that the system model is not reduced such that the reduced model fails to retain those portions of the code that define the behaviors the programmer intends to test. This may require, however, substantial time, effort and experience on the part of the programmer.

Thus, from all of the above, it can be appreciated that when using conventional formal verification tools to identify errors in a system model, the available computational resources may be fully exhausted before completion of the test, and/or the tester may be required to posses a high degree of skill for predetermining how to reduce the size of the system model without eliminating the so-called critical parts.

SUMMARY OF THE INVENTION

We have found that a given source of an error in a system model tends to repeat itself throughout the state space of the system model. That is, an error in one part of the system-model code will tend to cause the system model to assign an incorrect value to a system-model variable in response to more than one set of inputs, thus causing a search of the system-model state space to enter the same "bad" or unintended state or set of states in more than instance. As a result, the present inventors have realized that a verification tool may identify a given error in the system model as long as at least one of the set of inputs or input vectors that cause the incorrect assignment of values to a system-model variable is used during a search of the system-model state space.

Based on these realizations, the present inventors have found that an error in a system model can be detected by a verification tool without having to perform a conventional search of the system-model state space. Instead, in accordance with the present invention, an error in the system model may be identified by performing a search wherein the verification tool inputs, at a plurality of states of the system-model state space, only a subset or fraction of the complete set of inputs (i.e. a fraction of the set of inputs that would be used to perform a conventional search of the system model). Such a search is referred to herein as a partial search, as contrasted with the prior art type of search, referred to herein as a conventional search.

Performing a partial search of a system-model state space, instead of a conventional search, reduces the total number of inputs that a verification tool will input to the system model during a search of the system model state space, and thus reduces the amount of computational resources and/or time needed by the verification tool to check given properties of the system model. As a result, the present invention overcomes, to a significant extent, the limitations associated with the prior art.

In preferred embodiments, the subset of inputs is randomly generated so that, during the partial search, each input of the system model is fed a set of values that are randomly distributed over its range of assumable values (i.e. the range of the values it could possibly assume when the system model is in operation). By performing such a random partial search, instead of a partial search wherein each system-model input is fed a set of values that cover, for example, only a small portion of that input's range of assumable values, the verification tool may increase the probability that it will input one of the input vectors that would identify an error in the system-model (i.e. identify an incorrect value-assignment to a system-model variable).

Advantageously, fixing a system model error found in accordance with the principles of the present invention has the effect of eliminating each instance or repetition of the error in the system model state space. Just as a single error in the system model has a negative effect on the entire state space, a fix of the error has a positive effect on the entire state space. In addition, the ability to detect all the errors in a given system model can be enhanced by performing, in accordance with the principles of the present invention, a plurality of partial searches on the model These and other features of the invention will become more apparent from the detailed description of illustrative embodiment(s) of the invention when taken with the drawing(s). The scope of the invention, however, is limited only by the claims.

DETAILED DESCRIPTION OF ILLUSTRATIVE EMBODIMENTS OF THE INVENTION

Figure 1:
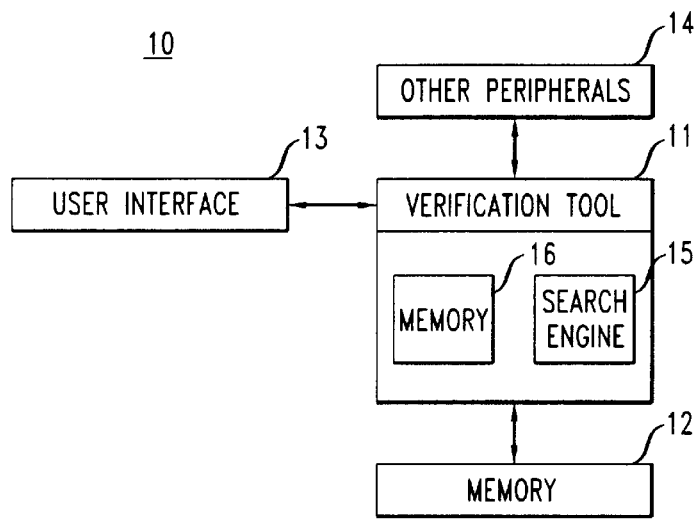
FIG. 1 is a block diagram of an apparatus for identifying errors in a system model by performing, in accordance with the principles of the present invention, a partial search of a state space representing the behavior of the system model.

Referring now to FIG. 1, there is shown a block diagram of an apparatus 10 for checking properties of a system model in accordance with the principles of the present invention. As shown, apparatus 10 comprises a verification tool 11 connected to an external memory 12, a user interface 13, and other peripherals 14. Verification tool 11 has a search engine 15 and an internal memory 16. User interface 13 is a conventional interface, such as a computer workstation or PC, through which, for example, a programmer can send information and verification commands to and receive information from verification tool 11. Other peripherals 14 includes devices and equipment, such as a printer, which verification tool 11 may utilize to print the results of given verification functions.

In operation, verification tool 11 invokes search engine 15 to perform, in accordance with the principles of the present invention, a partial search of a state machine representing the behavior of the system model as defined by the system-model code. A partial search, as stated above, is a search wherein the verification tool or search engine inputs, at a plurality of states of the system-model state space, only a subset or fraction of the complete set of inputs that would be used to perform a conventional search. That is, a partial search is a search of the system-model state space where the system-model inputs are fed only a fraction or subset of set of every possible value that they can possibly assume when the system model is in operation, at a plurality of states. The subset of inputs used to perform a partial search in accordance with the principles of the present invention is referred to herein as the partial search inputs.

Figure 2:
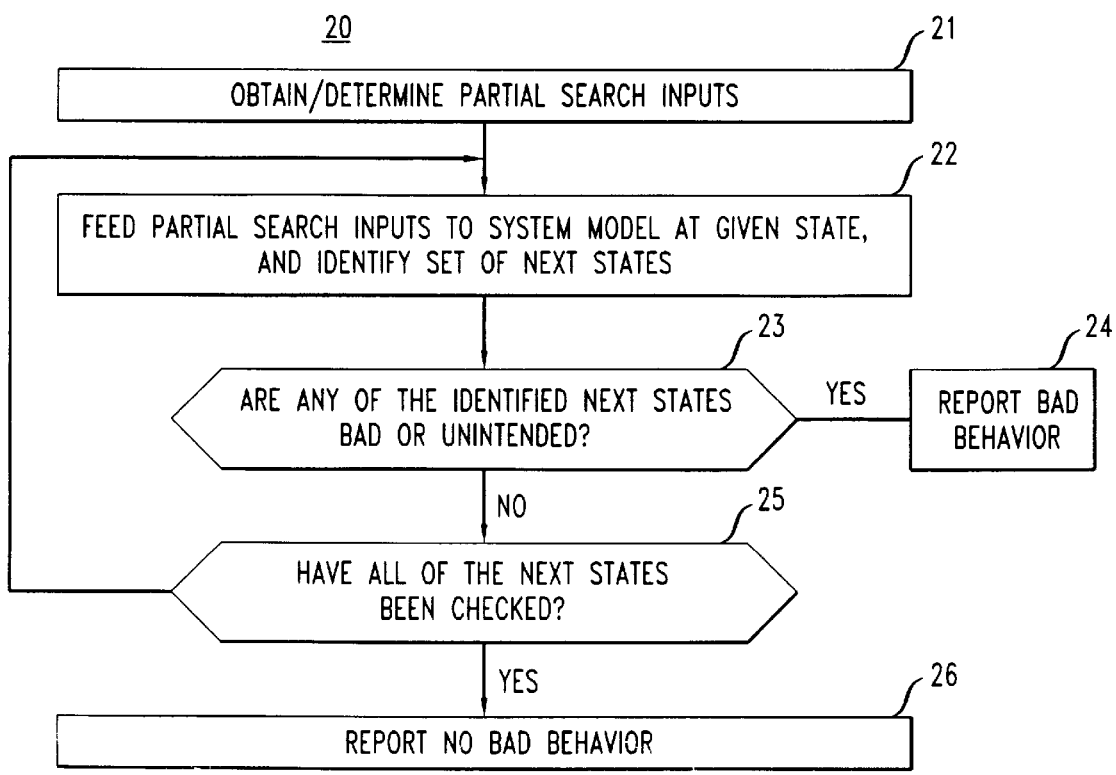
FIG. 2 is a block diagram of a method for checking properties of a system model by performing, in accordance with the principles of the present invention, a partial search of a state machine representing the behavior of the system model.

Referring now to FIG. 2, there is shown an illustrative embodiment of a method 20 for performing, in accordance with the principles of the present invention, a partial search of a state machine, using partial search inputs. As shown, method 20 begins at step 21 wherein a verification tool obtains the partial search inputs to be used during the partial search. Then, at step 22, the verification tool invokes a search engine to feed the partial search inputs to the inputs of the system-model at a given state of the system-model state machine, and identify the set of "next states" (i.e. the states that the system-model state machine enters as a result of the partial search inputs). The verification tool then determines, at step 23, whether any of the identified next states are bad or unintended states. A bad or unintended state is a state that represents a behavior that is not intended as a property of the system model being checked. If a bad or unintended state is identified, the verification tool reports, at step 24, that a bad behavior was found. If, however, no bad or unintended state is identified, then the verification tool determines, at step 25, whether all of the next states have already been checked. That is, the verification tool determines whether any of the identified next states have been checked in response to the partial search inputs. If all of the next states have already been checked, then the verification tool, at step 26, reports that no error was found. If, however, some of the next states have not been checked, then the search engine repeats steps 22–25 for each of the un-checked states until all of the next states have been checked, or until a bad behavior is found.

During the entire partial search of method 20, the verification tool stores a record of each set of inputs that was fed to the system-model inputs in each state, and stores a record of the behavior of the system model in response to the inputs. Once a bad behavior in the system-model state machine is identified, verification tool 11 is operable to report the set of inputs that caused the state machine to enter a bad state (i.e. the bad behavior). The report may enable, for example, a system designer to identify and fix the error in the system-model code that caused the bad behavior.

As stated above, the present inventors have found that a given source of an error in a system model tends to repeat itself throughout the state machine or state space representing the behavior of the system model. That is, an error in one part of the system-model code will tend to cause the system model to assign an incorrect value to a system-model variable in response to more than one set of inputs, thus causing a search of the system model to enter the same "bad" or unintended state in more than one instance.

Figure 3:
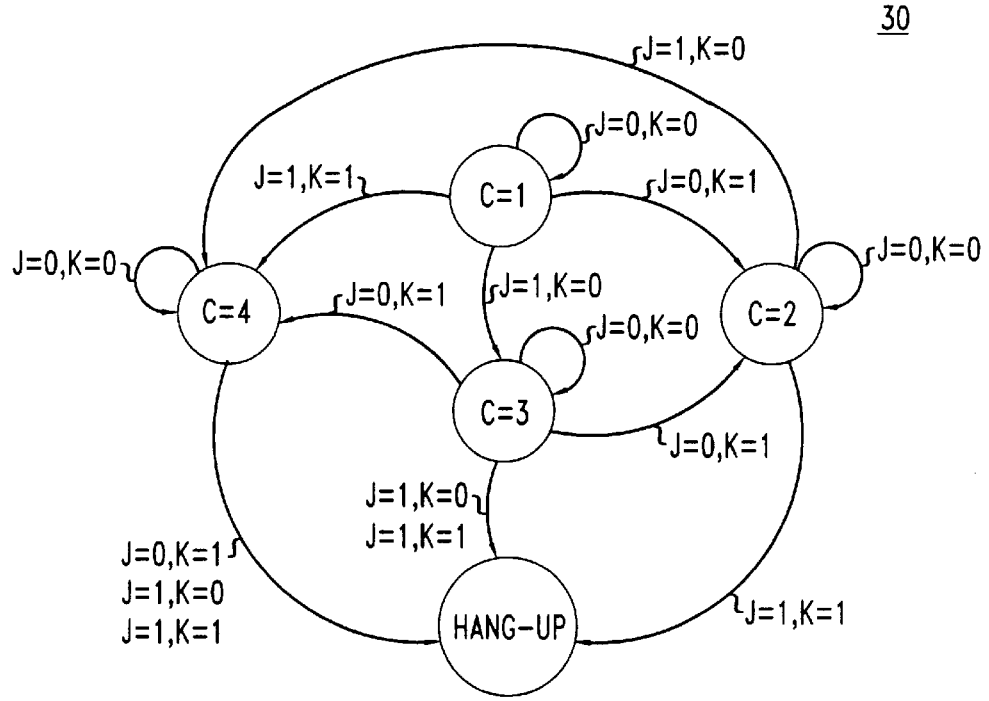
FIG. 3 is a diagram of a state machine representing the operation of an error-free model of a system.

To illustrate, let's assume that state machine 30, shown in FIG. 3, represents a model that accurately defines the intended behavior of a system or system model. In this illustration, the system model is intended to increment a count, C, by an amount depending on the value of Inputs J and K, and execute a "Hang-up" function whenever the value of C is assigned a value greater than 4. Specifically, if J=0 and K=0, then the value of C is not changed. If, J=0 and K=1, then the value of C is incremented by 1. If J=1 and K=0, then the value of C is incremented by 2. If J=1 and K=1, then the value of C is incremented by 3 And, if C is incremented to a value greater than 4, then the system performs a "Hang-up". The behavior of state machine 30, as summarized in the following table, is defined or controlled by the value assigned to system-model variable C which depends on the value of system-model inputs J and K.

| Present State | Inputs | System-Model Behavior |
| --- | --- | --- |
| State C = 1 | J = 0, K = 0 | No Action |
| | J = 0, K = 1 | Assign C = 2 |
| | J = 1, K = 0 | Assign C = 3 |
| | J = 1, K = 1 | Assign C = 4 |
| State C = 2 | J = 0, K = 0 | No Action |
| | J = 0, K = 1 | Assign C = 3 |
| | J = 1, K = 0 | Assign C = 4 |
| | J = 1, K = 1 | Hang-up |
| State C = 3 | J = 0, K = 0 | No Action |
| | J = 0, K = 1 | Assign C = 4 |
| | J = 1, K = 0 | Hang-up |
| | J = 1, K = 1 | Hang-up |
| State C = 4 | J = 0, K = 0 | No Action |
| | J = 0, K = 1 | Hang-up |
| | J = 1, K = 0 | Hang-up |
| | J = 1, K = 1 | Hang-up |

Figure 4:
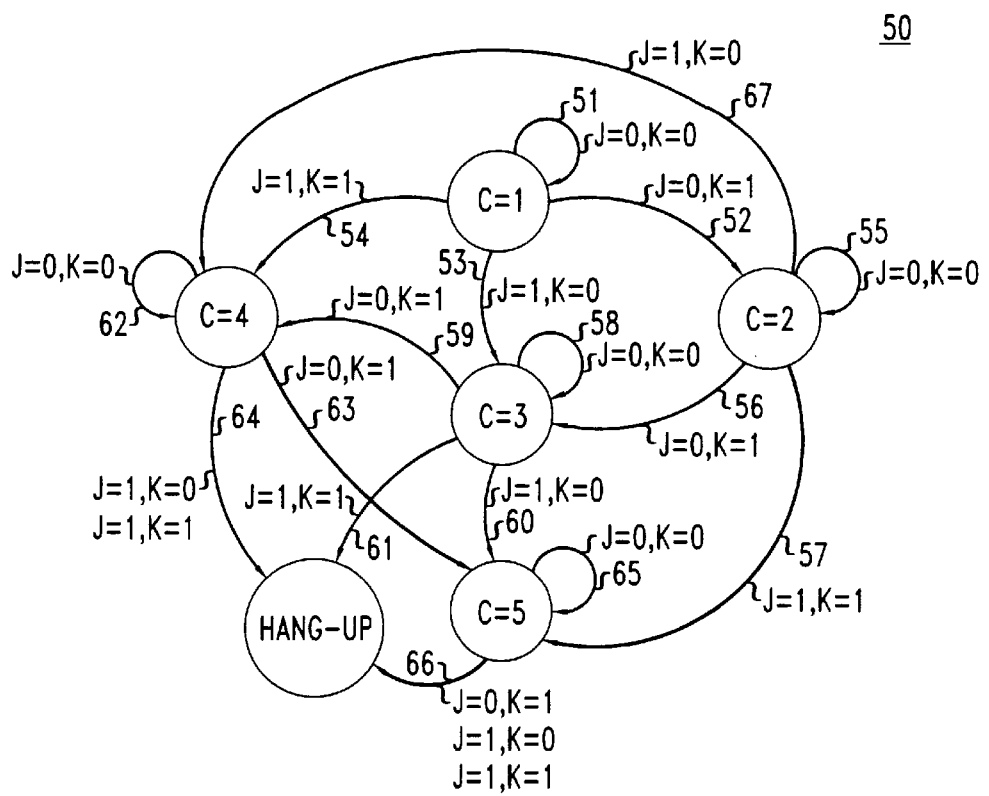
FIG. 4 is a diagram of a state machine representing the operation of an error-carrying model of the system of FIG. 3.

If, however, the system-model code contains an error such that the "Hang-up" function is executed when the value of C is greater than 5, instead of 4, then the error in the code will repeat itself throughout the state space of a state machine representing the behavior of the error-containing system model. Referring now to FIG. 4, there is shown a state machine 50 which represents the behavior of a system model containing this error.

As shown, state machine 50 has states C=1, C=2, C=3, C=4, C=5 and "Hang-up", and state transitions 51–67. State machine 50, as intended by the designers, transitions from one state to another depending on the present value of system-model variable C and the value of Inputs J and K. Contrary to the intended behavior, however, state machine 50 executes the "Hang-up" function when system-model variable C is assigned a value greater than 5. Thus, the above-described error in the system-model code will cause state machine 50 to enter bad state C=5 in response to many different sets of inputs in many different states. For example, state machine 50 can enter "bad" state C=5 either by inputting the input vector J=1, K=1 at state C=2, by inputting the input vector J=1, K=0 at state C=3, or by inputting the input vector J=0, K=1 at state C=4. Thus, if the verification tool inputs any of these sets of inputs during a search of state machine 50, the error in the system-model code can be identified. As a result, the single error in the system model code repeats itself throughout the state space of the state machine representing the behavior of the system model.

In discovering this "repeating" of the error, the present inventors have realized that a verification tool may detect the presence of an error in the system model as long as at least one of the sets of inputs that cause the incorrect assignment of values to a system-model variable (i.e. entering a bad state) is used during a search of the system-model state space. As a result, the present inventors have found that a large number of errors in the system-model state space can be detected by performing, in accordance with the principles of the present invention, a search that includes only a fraction of the complete set of inputs, i.e. a partial search.

Referring now to state machine 50 shown in FIG. 4, the mechanics of such a partial search can be understood. A partial search of state machine 50 in accordance with the principles of the present invention is a search wherein only a fraction or subset of the complete set of inputs are fed to the system-model Inputs at each state. To illustrate, assuming the partial search inputs are the set of inputs J=0, K=1 and the set of inputs J=1, K=1, a partial search of state machine 50 may begin at state C=1 by feeding the system-model the input vector J=0, K=1 and J=1, K=1, successively, and monitoring the behavior of the state machine in response thereto. Since the inputs will cause the verification tool to identify C=2 and C=4 as the set of next states, the tool will then feed the same inputs to state machine 50 at each of these next states, and monitor the behavior of the state machine in response thereto. Since inputting the set of inputs J=1, K=1, at state C=2, and the set of inputs J=0, K=1 or J=1, K=1 at state C=4 will cause the state machine to enter "bad" state C=5, the verification tool will detect and report that an error exists in the system-model during any one of these sets of inputs or instances.

As a result, the verification tool will detect the presence of an error without having to input the complete set of inputs at each state, as required during a conventional search. To illustrate, during a conventional search of state machine 50, the verification tool would detect the presence of an error only after inputting, at state C=1, the set of inputs: J=0, K=0; J=0, K=1; J=1, K=0; and J=1, K=1, in every possible sequence (i.e. 24 different sequences), identify the set of "next states," and, for each of the identified next states, inputting the sets of inputs in every possible sequence until one of the above-described instances occurred. Thus, advantageously, by performing a partial search in accordance with the principles of the present invention, a verification tool may identify system-model errors using only a fraction of the time and/or computational resources than required when performing a conventional search.

Moreover, as stated above, once an instance of the error is identified during a partial search in accordance with the principles of the present invention, every instance of the error in the system model state space can be eliminated by fixing that single error in the system-model code. To illustrate, once the code of the system model represented by state machine 50 is debugged to properly execute a "Hangup" when the value of system-model variable C is greater than 4, the state machine representing the debugged system model will no longer contain state 5. As a result, the so-called debugged state machine will look and behave more like state machine 30 (i.e. the intended behavior) than state machine 50.

It should be noted that performing a partial search in accordance with the principles of the present invention, instead of a conventional search, does not substantially reduce the probability that the verification tool will identify that an error exists in the system-model, as compared to the prior art. This is due to the fact that an error in the system model code, as described above, tends to repeat itself throughout the state space of the state machine representing the behavior of the system model. Thus, the verification tool may have a number of chances to input a set of inputs at a given state that would cause the state machine to enter the bad state resulting from the error in the system-model code. That is, even though the partial search inputs may not include every set of inputs that would cause the state machine to enter the bad state in every possible instance, the fact that the error is repeated throughout the state space provides the verification tool with substantial opportunity to detect at least one instance of the error.

It should also be noted that a partial search in accordance with the principles of the present invention differs from a so-called random simulation because a random simulation does not involve searching a state space representing the behavior of a system model, as described above. Rather, a random simulation, or any simulation for that matter, involves simply feeding inputs to the system model, and monitoring the immediate set of outputs or behavior of the system model in response to those inputs. Moreover, conventional simulation tools provide no means for keeping track of which states have already been checked, and which properties or behaviors have or have not been demonstrated over time. As a result, conventional simulators do not provide the ability to check so-called eventuality properties of the system model (i.e. system-model behaviors that may not be apparent or demonstrated until some time after a given set of inputs or triggering event), as provided by a verification tool using a partial search in accordance with the present invention. In addition, such conventional random simulators, even when using a partial set of the complete set of inputs, may repeatedly check the same property over and over again, thus failing to efficiently check a behavior or given transition into a "next state", as described above, only once.

For clarity of explanation, the embodiment of the method steps shown in FIG. 2 and described herein is merely illustrative. Thus, for example, it will be appreciated by those skilled in the art that the specific method shown and described herein represents a conceptual view of illustrative steps embodying the principles of the present invention. In addition, it will be appreciated by those skilled in the art that any set of steps or means can be employed to accomplish the steps shown and described herein.

For example, in particular embodiments, the partial search inputs can be obtained by randomly generating a set of inputs with the aid of a random number generator. Or, the partial search inputs can be chosen such that the values assumed by each input during the partial search include every other value in its range of assumable values. In such embodiment, the verification tool can be empowered to randomly choose the values of the system model inputs during the partial search. This eliminates the need for a programmer, experienced in the details of the model, to make decisions as to which values should be tested for each system model input.

In the claims hereof any element expressed as a means for performing a specified function is intended to encompass any way of performing that function including, for example, a) a combination of circuit elements which performs that function or b) software in any form (including, therefore, firmware, microcode or the like) combined with appropriate circuitry for executing the software to perform the function. The invention defined by such claims resides in the fact that the functionalities provided by the various recited means are combined and brought together in the manner in which the claims call for. Applicant thus regards any means which can provide those functionalities as equivalent as those shown herein.

It will be appreciated by those skilled in the art that they will be able to devise various arrangements which, though not explicitly shown or described herein, embody the principles of the present invention and thus are within its spirit and scope.

We claim:

1. A formal verification method comprising the steps of:

with a formal verification tool, performing a partial search of a state space that represents the behavior or a system model, the partial search performed by inputting, at a plurality of states of the state machine, only a subset of a complete set of inputs, said complete set of inputs comprising every possible input that the system-model inputs can possibly assume, when the system model is in operation, in every possible sequence; and monitoring the behavior of the system model as a result of inputting said subset of the complete set of inputs.

2. The method of claim 1 wherein the step of monitoring the behavior of the system model comprises identifying errors in the system model.

3. The method of claim 2 further comprising the step of randomly generating said subset of the complete set of inputs.

4. The method of claim 3 wherein said formal verification tool is an explicit-state, enumeration-based formal verification tool.

5. The method of claim 4 further comprising the step of fixing said errors identified in the system model.

6. A method comprising the steps of:

with a formal verification tool, performing a partial search of a state space that represents the behavior of a system model, the partial search performed by:

1) inputting at a state of the state machine, only a subset of a complete set of inputs, said complete set of inputs comprising every possible input that the system model input can assume at that state, to identify a subset of all possible next states;

2) inputting a second subset of a complete set of inputs which are possible at at least one of the identified next states; and 3) determining whether any of said identified next states represent an unintended behavior of the system model in response to given inputs.

7. The method of claim 6 comprising the steps of randomly generating said subset of a complete set of inputs and randomly generating said second subset of a complete set of inputs so that, during said inputting steps, each input of the system model is fed a set of values that are randomly distributed over its range of assumable values.

8. The method of claim 7 further comprising the steps of:

identifying the set of inputs that caused the system model to enter a next state identified as representing an unintended behavior; and based on the identified set of inputs, identifying an error in the system model that caused the unintended behavior.

9. An apparatus comprising:

a formal verification tool operable to identify errors in a system-model by performing a partial search of a state space that represents the behavior of the system model, said partial search being a search wherein only a subset of a complete set of inputs are input to the system model at each state of the system-model state space, said complete set of inputs comprising every possible input that the system-model inputs can possibly assume, when the system model is in operation, in every possible sequence.

10. The apparatus of claim 9, further comprising a random number generator that is co-operable with said formal verification tool to randomly generate said subset of said complete set of inputs.

* * * * *